United States Patent [19]

Chai et al.

[11] Patent Number: 5,483,180

[45] Date of Patent: Jan. 9, 1996

[54] DATA AND CLOCK RECOVERY CIRCUIT

[76] Inventors: Sang-Hoon Chai, Hanbit Apt. 136-1503, Eoeun-dong, Yusong-ku; Mun-Yang Park, Hanul Apt. 105-806, Sinsung-dong, Yusong-ku; Myung-Shin Kwak, Hanbit Apt. 108-1602, Eoeun-dong, Yusong-ku; Hae-Wook Choi, Joogong Apt. 3-204, Doryong-dong, Yusong-ku, all of Daejeon, Rep. of Korea

[21] Appl. No.: 346,206

[22] Filed: Nov. 22, 1994

[30] Foreign Application Priority Data

Dec. 14, 1993 [KR] Rep. of Korea ............... 93-27623

[51] Int. Cl.[6] ............................................. H03K 5/13
[52] U.S. Cl. ..................... 326/93; 370/100.1; 375/346; 375/354
[58] Field of Search ................ 326/9, 93; 370/100.1; 371/47.1; 375/82, 99, 106, 108

[56] References Cited

U.S. PATENT DOCUMENTS

| | | | |
|---|---|---|---|
| 4,232,197 | 11/1980 | Acampora et al. | 370/97 |
| 4,675,861 | 6/1987 | Uttermark | 326/93 X |
| 4,754,225 | 6/1988 | Minuhin | |
| 5,103,466 | 4/1992 | Bazes | |
| 5,327,466 | 7/1994 | Marinaro | 375/106 |
| 5,406,561 | 4/1995 | Arai | 370/100.1 X |
| 5,418,822 | 5/1995 | Schlachter et al. | 326/93 X |

*Primary Examiner*—David R. Hudspeth
*Attorney, Agent, or Firm*—Larson and Taylor

[57] ABSTRACT

Disclosed is a data and clock recovery circuit possible to restore data signals and synchronizing clocks which have been distorted during transmission over the communication line, which is comprised of the following: main oscillation loop that maintains operating frequency by using the input data and a self oscillation loop that operates using reference clock embedded within multiplex communication devices when communication lines get shorted or when power is restored after an outage; loop selecting switch which selects the main oscillation loop during normal operating mode and selects the self oscillation loop when communication line shorts or when the power is being restored; data signal monitor which connects to the loop selecting switch and determines communication line shorting by monitoring data transmission; power supply monitor which connects to the loop selecting switch and monitors the restoration of power after an outage. The circuit maintains stable operation and supplies stable output to multiplex communication devices not only during the normal operating conditions, but also when there is a communication line shorting or restoration of power after a power supply outage.

4 Claims, 3 Drawing Sheets

DATA AND CLOCK RECOVERY CIRCUIT

BACKGROUND OF THE INVENTION

1. Field of the Invention

The present invention relates to a data and clock recovery circuit in which a distorted data signal transmitted through a communication line can be recovered so as to maintain stable operation not only during normal operating conditions but also when the communication line shorts or when power supply is restored after an outage.

2. Description of the Prior Art

Generally, data and clock recovery circuits are necessarily used in multiplex communication devices which process signals transmitted through communication lines, such as an electronic switching system. As the frequency of the transmitted signals is increased to such a frequency as 155.52 MHz or 622.08 MHz, high speed operation is required for such a data and clock recovery circuit. To maintain the stability of the system, the data and clock recovery circuit also has to maintain stable operation therein even when outside conditions change. Data and clock recovery circuits usually use the phase-locked loop (PLL) method, but because of its characteristics, the circuit can produce a clock with frequency outside of the operating frequency when there is an interruption or a discontinuance of data signal caused by shorting of the communication line or by discontinuance of transmission from the signal source. In worst cases, the operation of a clock itself can discontinue. Also, when there is an accidental power outage or when there is a power shut-off for system maintenance, the clock frequency may not converge to operating frequency and may malfunction after the power is restored because of the characteristics that a PLL circuit has.

SUMMARY OF THE INVENTION

It is therefore an object of the present invention to provided a data and clock recovery circuit to solve the problems that said conventional data and clock recovery circuits have.

It is another object of the present invention to provide a data and clock recovery circuit in which its operation frequency can be maintained even when a power is restored after a power outage or when there is an interruption or a discontinuance of data transmission.

According to the aspect of the present invention to achieve the above mentioned objectives, the data and clock recovery circuit for restoring data signals distorted during transmission over the communication line and providing a synchronizing clock required for multiplex communication device, said circuit comprises a main oscillation loop for maintaining its operating frequency by using input data signals transmitted from the communication line; a self oscillation loop for operating during restoration of power after a power outage or during data transmission discontinuance by using a reference clock of the circuit; a loop selecting switch connected to the main and self oscillation loops, for selecting the main oscillation loop during normal operation of the circuit and selecting the self oscillation loop during restoration of power after a power outage or during data transmission discontinuance; a data signal monitor connected to an input of the loop selecting switch, for monitoring the input data signals from the communication line so as to detect shortage of the communication line; and a power supply monitor connected to the other input of the loop selecting switch, for monitoring the restoration of power after a power outage.

The circuit maintains stable operation and supplies stable output to multiplex communication devices not only during the normal operating conditions, but also when there is a communication line shorting or restoration of power after a power supply outage.

BRIEF DESCRIPTION OF THE DRAWINGS

The above and other advantages of the present invention will become more apparent from the following detailed description with reference to the accompanying drawing, in which.

DETAILED DESCRIPTION OF THE INVENTION

Figure 1:
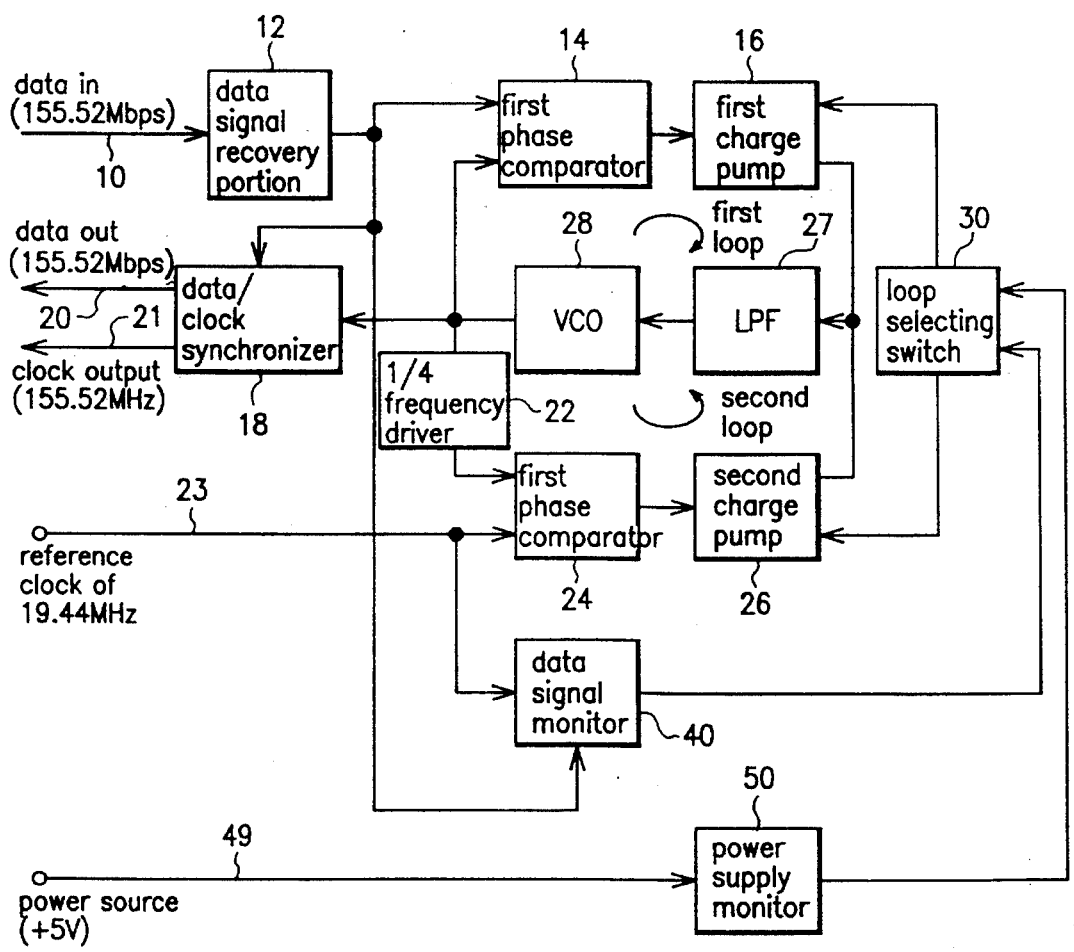
FIG. 1 is a schematic block diagram showing a data and clock recovery circuit according to the embodiment of the present invention.

FIG. 1 is a block diagram showing the data and clock recovery circuit according to the present invention. In FIG. 1, reference numerals 14 and 24 are phase comparators, numerals 16 and 26 are charge pumps, numeral 27 is a low pass filter, numeral 28 is a voltage controlled oscillator (VCO), numeral 22 is a ¼ frequency divider, numeral 30 is a loop selecting switch, numeral 40 is a data signal monitor, numeral 50 is a power supply monitor connected between a power source terminal 49 and the loop selecting switch 30, numeral 12 is a data recovery portion for receiving input data signals through an input line 10, and numeral 18 is a data and clock synchronizer for generating data of 155.52 Mbps in transmission speed through a data output terminal 20 and a synchronizing clock of frequency 155.52 MHz through a clock output terminal 21.

Referring to FIG. 1, the data recovery portion 12 restores distorted signals from the input line 10 as the communication line. The data signal restored by the data recovery portion 12 is applied to the first phase comparator 14, together with the clock signal from the VCO 28. Then, the first phase comparator 14 compares the phase of the restored data signal with that of the clock signal to generate and provide a first phase compared signal corresponding to a phase difference of two input signals to the first charge pump 16. The first charge pump 16 then produces a first charge signal having the amount of charges proportional to the phase difference in order to maintain stable operation of a PLL circuit.

The first charge pump 16 is connected to the low pass filter 27 which filters out high frequency of the charge signal therefrom. The low pass filter 27 is coupled to the VCO 28 for generating either 155.52 MHz or 622.08 MHz clocks.

The VCO 28 is coupled to a ¼ frequency divider 22 which divides a frequency of the clock from the VCO 28. The divided clock signal from the ¼ frequency divider 22 is applied to the second phase comparator 24, together with a reference clock of 19.44 MHz frequency to be applied from a reference clock terminal 23.

The second phase comparator 24 then compares the phases of two input signals thereof to generate and provide a second phase compared signal to the second charge pump 26. Similarly to the first charge pump 16, the second charge pump 26 produces the second charge signal having the amount of charges proportional to the phase difference in order to maintain stable operation of a PLL circuit. The second charge pump 26 also is connected through the low pass filter 27 to the VCO 28.

Figure 2:
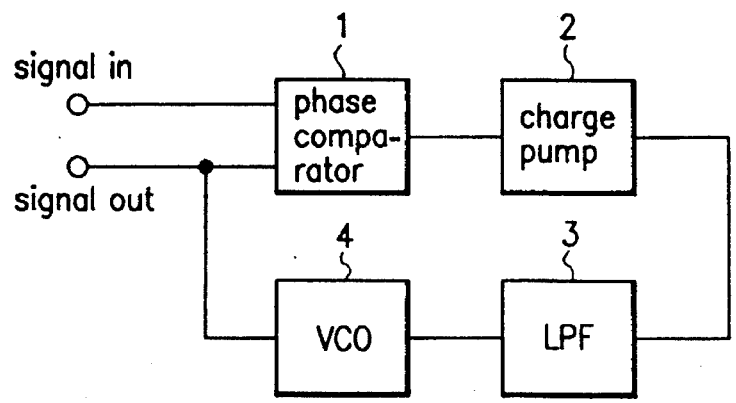
FIG. 2 is a block diagram of typical PLL circuit.

In this embodiment, each of the first and second loops has phase comparator and charge pump and further has commonly the low pass filter 27 and the VCO 28, as shown in FIG. 1. The second loop further comprises a ¼ frequency divider. Each of the first and second loops functions as a PLL circuit having the construction as shown in FIG. 2. The loop selecting switch 30 receives the output signals of the data signal and power supply monitors 40, 50 to select either the first loop or the second loop.

On the other hand, the output signals of the data recovery portion 12 and the VCO 28 are applied to the data and clock synchronizer 18 so as to make the signals in phase with each other. The data signal monitor 40 receives the data signal from the data signal recovery portion 12 and the reference clock signal of 19.44 MHz frequency so as to monitor the data signal. The power supply monitor 50 is connected to the external power supply terminal 49 and monitors the power outage.

The data signal recovery circuit 12 as well-known in this art is composed of Schmitt triggers, inverters and so on (not shown), and it can restore the distorted data signals (either 155.52 Mbps or 622.08 Mbps).

In this embodiment, the first loop is utilized for comparing the phases of the restored data signal from the data signal recovery portion 12 and the clock signal from the VCO 28, and thus for adjusting the clock signal from the VCO 28 to synchronize the clock and restored data signals. The data and clock signal synchronizer 18 adjusts the end phase of the clock signal which was synchronized with the restored data signal and then outputs both signals. The data signal recovery circuit 12, the PLL circuit of the first loop, and the data and clock synchronizer 18 all constitutes a conventional data and clock recovery circuit.

The data and clock recovery circuit according to the present invention has the second loop which is self oscillation circuit, a data signal monitor 40, a power supply monitor 50, and the loop selecting switch 30 in addition to the construction of the conventional data and clock recovery circuit.

The second loop has similar structure to the first loop but further comprises an additional ¼ frequency divider. When there is an interruption or a discontinuance of data transmission because of communication line shorting or when the first loop is not operating properly after the power is restored after a power outage, the second loop starts to operate in response to the output signals of the monitors 40 and 50 for monitoring them. The second loop uses the reference clock (usually 19.44 MHz) in the system as the data signal and compares its phase with that of the clock signal from the VCO 28 to adjust the frequency of the clock signal from the VCO 28. As a result, the second loop functions as a self oscillation circuit in which a stable clock signal synchronized to the reference clock can be provided to the system.

The ¼ frequency divider 22 in the second loop is composed of two T flip-flops (not shown in FIG. 1) connected in series. It divides the frequency of the clock signal from the VCO 28 and provides the signal divided thus to the second phase comparator 24 so that the phases of the reference clock and the clock from the VCO 28 can be compared as in the first loop. The second phase comparator 24 has the same structure as the first phase comparator 14. Also, the second phase comparator 24 can further include a frequency comparator necessary for reducing a great frequency difference between the clock frequency from the VCO 28 and the frequency (155.52 MHz or 622.08 MHz) within the normal operation range. Thus, when there is a great difference between them, the difference can be reduced by using the frequency comparator, and the second phase comparator is operated afterward.

Figure 3:
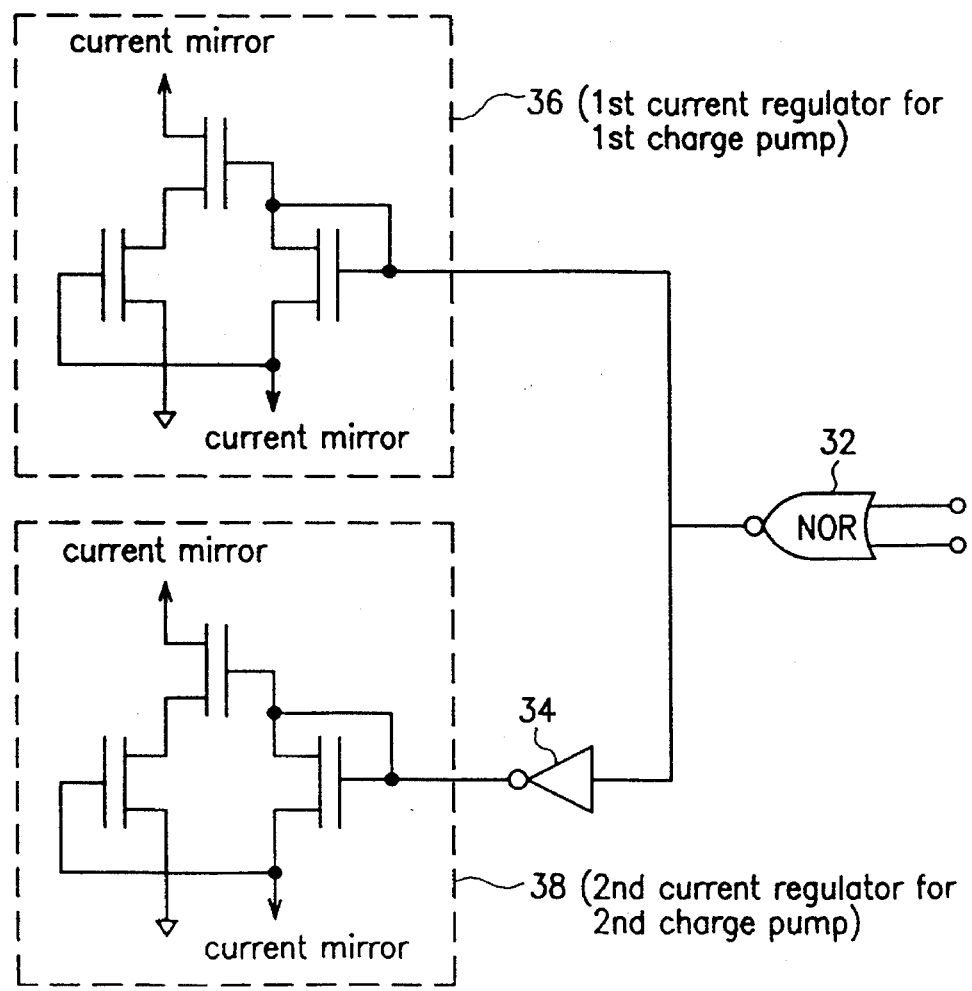
FIG. 3 is a circuit diagram of the loop selecting switch of the data and clock recovery circuit as shown in FIG. 1.

With reference to FIG. 3, the loop selecting switch 30 has an NOR gate 32 connected to outputs of the monitors 40 and 50, an invertor 34 coupled to the output of the NOR gate 32, a first current regulator 36 coupled to the output of the NOR gate, and a second current regulator 38 coupled to the output of the invertor. By the loop selecting switch 30, either the first loop or the second loop can be selectively operated. The first current regulator 36 has the same structure as the second current regulator 38, and is composed of three NMOS transistors, as shown in FIG. 3.

One of the input terminals of the NOR gate 32 receives the clock signal from the data signal monitor 40, and the other receives the signal from the power supply monitor 50. If the output signals of both the data signal monitor 40 and the power supply monitor 50 are logical "0" state (low level), then the NOR gate 32 outputs logical "1" state (high level), but in other cases, it outputs "0" (low level). The output of the NOR gate 32 is coupled to the gate of an NMOS transistor in the first current regulator switch 36 for the first charge pump 16, and the output thereof is also coupled to the gate of an NMOS transistor in the second current regulator switch 38 vie the invertor 34. Consequently, when the outputs of the data signal monitor 40 and the power supply monitor 50 are "0", the first current regulator switch 36 for the first charge pump 16 turns on because the output of the NOR gate 32 is "1". Then, the second current regulator switch 38 for the second charge pump 26 turns off, and therefore the first loop is operated normally, but the second loop maintains to turn off in operation thereof. Consequently, when the outputs of either or both of the data signal monitor 40 and the power supply monitor 50 are "1", the second current regulator switch 38 for the second charge pump 26 turns on because the output of the NOR gate 32 is "0". Then, the second loop is operated normally, but the first loop maintains to turn off in operation thereof.

Figure 4:
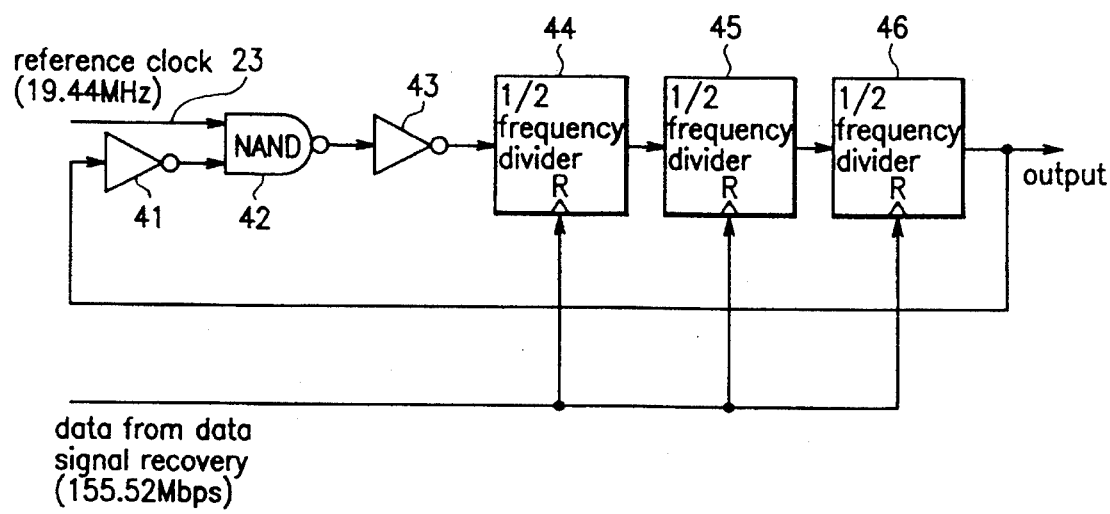
FIG. 4 is a circuit diagram of the data signal monitor of the circuit as shown in FIG. 1.

The data signal monitor 40, as shown in FIG. 4, is composed of a first invertor 41 having input and output terminals, an NAND gate 42 coupled to receive the reference clock and an output signal of the first invertor 41, a second invertor 43 for inverting an output signal of the NAND gate, and three frequency dividers 44, 45, 46 connected in series between outputs of the second invertor 43 and (last one of the three dividers. Also, each of the three dividers has a reset terminal for receiving the input data signal from the data input terminal 10.

In this data signal monitor 40, if more than 64-input data signals are "0" continuously, the output of the data signal monitor 40 changes from "0" to "1" and maintains the high level "1" until the input data of "1" is received. Usually, if more than 50-input data signals are "0" continuously, it means that a communication line has shorted or data transmission has stopped. However, the data signal monitor 40 checks continuous 64-input data signals so as to determine whether the line has shorted or the transmission has stopped.

When any one of data signals having transmission speed of 155.52 Mbps has "1", the data signal monitor 40 resets the ½ frequency dividers 44 to 46 so as to maintain "0" at the output of the dividers. But if the data signals are continuously "0", the data signal monitor 40 starts to count up or down using the 19.44 MHz reference clock. Then, if 8-clock signals of the 19.44 MHz reference clock are counted, or when 64-input data signals in 155.52 Mbps transmission speed are continuously "0", the output of the monitor 40 becomes "1". The output thereof is fed back to the NAND gate 42 through the invertor 41 so that the output can be maintained at "1" until an input data signal of "1" is received. Therefore, the data signal monitor 40 outputs "0" when data signal is applied thereto, but outputs "1" if input data signals of 64-clock and more are not applied thereto. In the latter case, the data signal monitor 40 recognizes whether the communication line has shorted or the data transmission has stopped.

Figure 5:
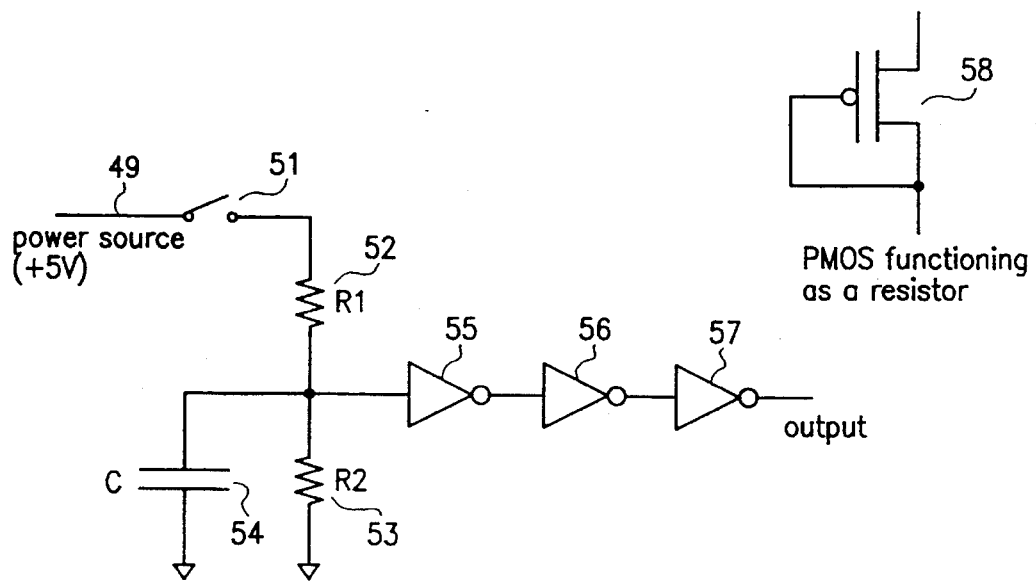
FIG. 5 is a circuit diagram of the power supply monitor of the circuit as shown in FIG. 1.

The power supply monitor 50, as shown in FIG. 5, is composed of a power switch 51, resistors 52 and 53 connected in series between the power switch 51 and a ground source, a capacitor 54 connected between the junction point of the resistors 52, 53 and the ground source, inverters 55, 56, and 57 connected in series between the junction point and the output of the power supply monitor 50, and a PMOS transistor 58 which acts as a resistor. Reference symbols R1 and R2 are resistances of the resistors 52 and 53, respectively. Reference symbol C is capacitance of the capacitor 54.

When the power switch 51 turns on after it was turned off, the power supply monitor 50 outputs "1" at first, but outputs "0" after a while. It is a type of time delay circuit. When the power switch 51 is turned off, the capacitor 54 is discharged through the resistor 53 and the voltage across the capacitor 54 is lowered. As a result, the power supply monitor 50 outputs "1".

When the power switch 51 is turned on, the capacitor 54 is charged through the resistor 52, and the voltage of the capacitor 54 is increased until it is high enough to change the output of the invertor 55 from "1" to "0". As a result, the power supply monitor 50 outputs "1" when the power switch 51 is turned off, but the output thereof changes back to "0" during the power restoration after some time (R1×C) has passed.

In this embodiment, the data and clock recovery circuit selects the first loop when the power is turned on and the data signal is received therein because both the power supply monitor 50 and the data signal monitor 40 output "0", so as to carry out the operation for comparing the phases of the input data signals with each other. However, if the power is turned off or no data is transmitted for more than 64 counts, both the data signal monitor 40 and the power supply monitor 50 output "1", and thus the loop selecting switch selects the second loop. Accordingly, in The second loop the phases of the reference clock and the clock from the VCO 32 is carried out in comparison to maintain stability.

According to the present invention, the data and clock recovery circuit may maintain stable operation not only during normal operating conditions but also when data transmission has stopped or when the system is recovering from a power outage.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A data and clock recovery circuit for restoring data signals distorted during transmission over the communication line and providing a synchronizing clock required for multiplex communication device, said circuit comprising:

a main oscillation loop for maintaining its operating frequency by using input data signals transmitted from the communication line;

a self oscillation loop for operating during restoration of power after a power outage or during data transmission discontinuance by using a reference clock of the circuit;

a loop selecting switch connected to the main and self oscillation loops, for selecting the main oscillation loop during normal operation of the circuit and selecting the self oscillation loop during restoration of power after a power outage or during data transmission discontinuance;

a data signal monitor connected to an input of the loop selecting switch, for monitoring the input data signals from the communication line so as to detect shortage of the communication line; and a power supply monitor connected to another input of the loop selecting switch, for monitoring the restoration of power after a power outage.

2. The data and clock recovery circuit as defined in claim 1, wherein said loop selecting switch comprises an NOR gate connected to outputs of the monitors; a first inverter coupled to an output of the NOR gate; a first current regulator coupled to the output of the NOR gate; and a second current regulator coupled to the output of the first inverter.

3. The data and clock recovery circuit as defined in claim 1, wherein said data signal monitor comprises a second inverter having input and output terminals; an NAND gate coupled to receive the reference clock and an output signal of the second inverter; a third inverter for inverting an output signal of the NAND gate; three frequency dividers connected in series between outputs of the third inverter and last one of the dividers, each of the dividers having a reset terminal for receiving the input data signal.

4. The data and clock recovery circuit as defined in claim 1, wherein said power supply monitor comprises a power switch, resistors connected in series between the power switch and a ground source, a capacitor connected between a junction point of the resistors and the ground source, three inverters connected in series between the junction point and the output of the power supply monitor, and a PMOS transistor that act as a resistor.

* * * * *